United States Patent [19]

Uda et al.

[11] Patent Number: 4,669,867
[45] Date of Patent: Jun. 2, 1987

[54] ALIGNMENT AND EXPOSURE APPARATUS

[75] Inventors: Koji Uda; Kazuyuki Oda, both of Yokohama; Naoki Ayata, Machida, all of Japan

[73] Assignee: Canon Kabushiki Kaisha, Tokyo, Japan

[21] Appl. No.: 701,623

[22] Filed: Feb. 14, 1985

[30] Foreign Application Priority Data

Feb. 20, 1984 [JP]  Japan ................................. 59-28794
Feb. 21, 1984 [JP]  Japan ................................. 59-29511
Apr. 23, 1984 [JP]  Japan ................................. 59-80064

[51] Int. Cl.$^4$ ............................................. G03B 27/42
[52] U.S. Cl. .................................... 355/53; 355/77; 356/400
[58] Field of Search ................ 355/53, 43, 45, 54, 355/77, 86, 95; 356/400, 401; 352/349

[56] References Cited

U.S. PATENT DOCUMENTS 4,057,347 11/1977 Moriyama et al. .
4,110,762  8/1978 Tigreat ............................ 355/53 X
4,153,371  5/1979 Koizumi et al. .................... 356/400
4,362,385 12/1982 Lobach ............................ 355/53 X
4,553,834 11/1985 Ayata et al. ...................... 355/53

*Primary Examiner*—L. T. Hix
*Assistant Examiner*—D. Rutledge

*Attorney, Agent, or Firm*—Fitzpatrick, Cella, Harper & Scinto

[57] ABSTRACT

An alignment and exposure apparatus in which sequential operations of pattern projection for projecting a pattern of a first object, at a reduced ratio, onto a second object through an optical system, stepwise movement for moving the second object stepwise relative to the first object, detection for detecting any positional deviation between the first and second objects at a position at which the stepwise movement of the second object is terminated, and correction for correcting the positional relation between the first and second objects on the basis of the detected positional deviation, are repeated relative to the second object to thereby print the patterns onto the second object in a reduced scale. Upon correction of the positional relation between the first and second objects, at least one of the first and second objects is displaced in accordance with the magnitude of the detected positional deviation and/or, upon stepwise movement of the second object, the amount of stepwise movement to be made is corrected in accordance with the detected positional deviation with respect to the position at which the preceding stepwise movement of the second object is terminated. By this, the time required for repetitions of exposures is reduced.

10 Claims, 16 Drawing Figures

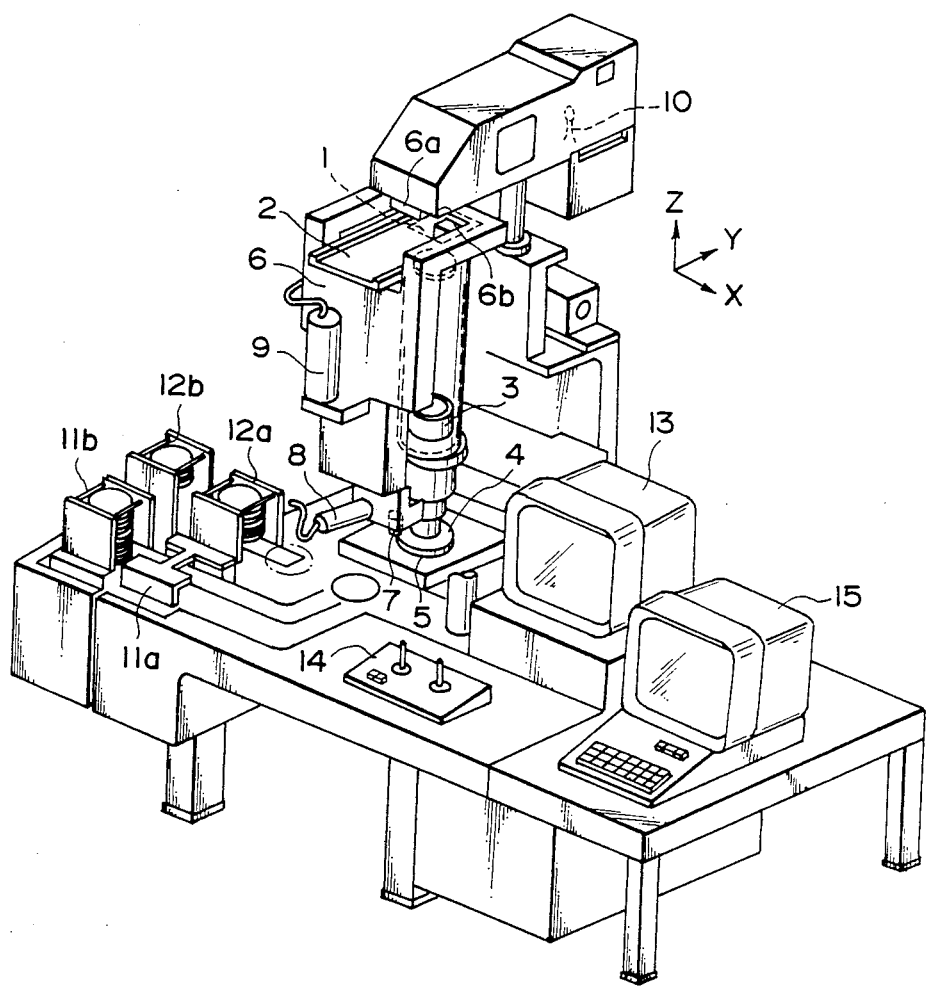
F I G. 1

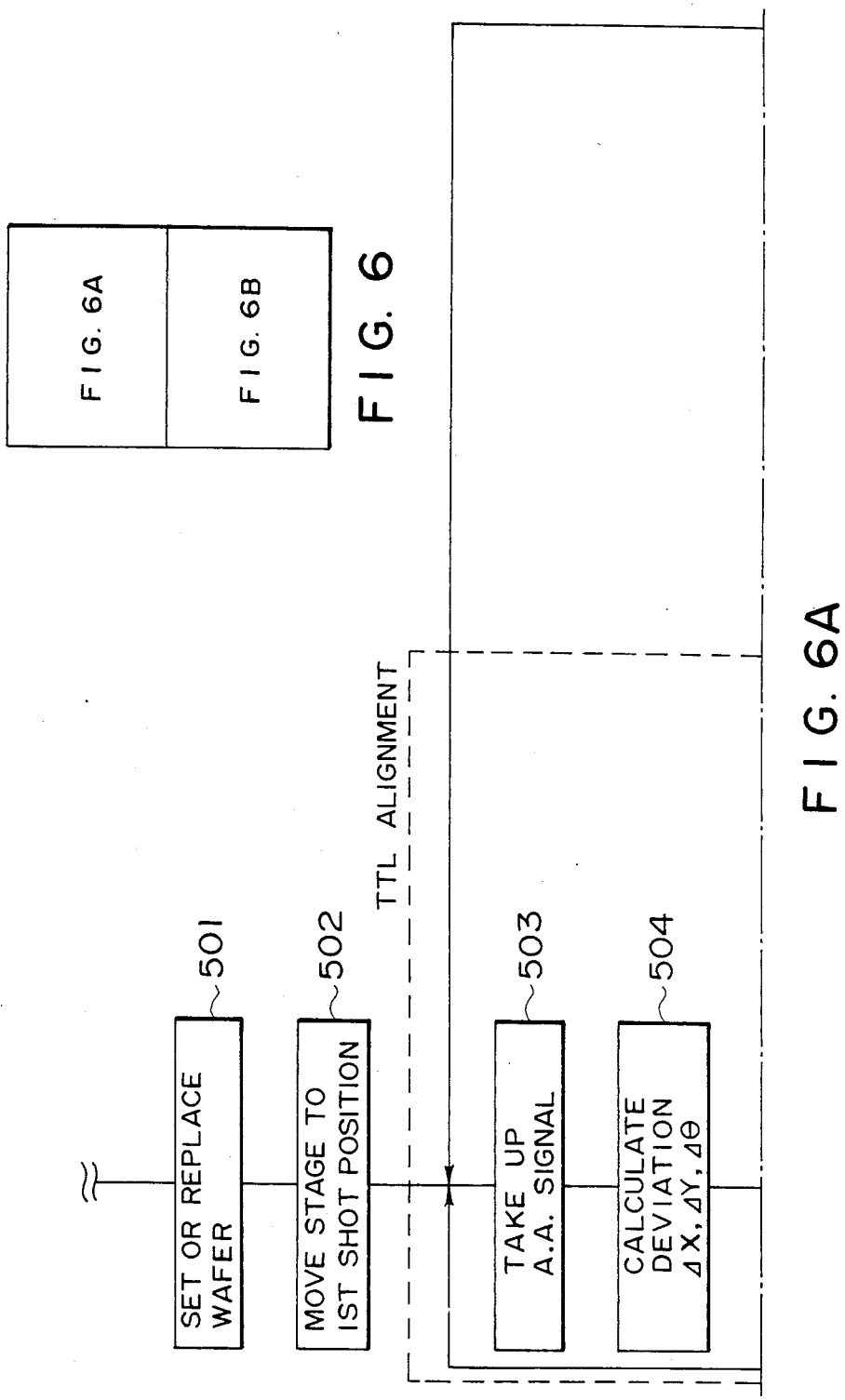

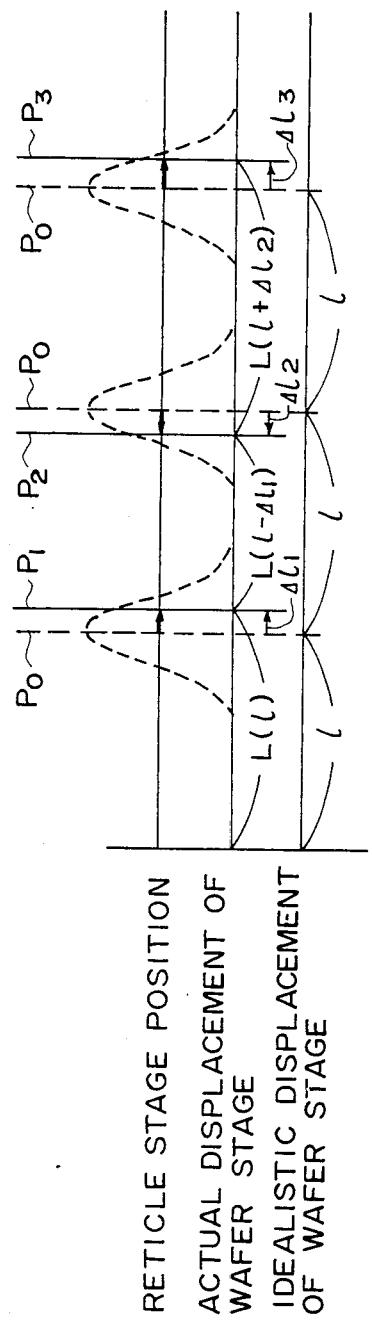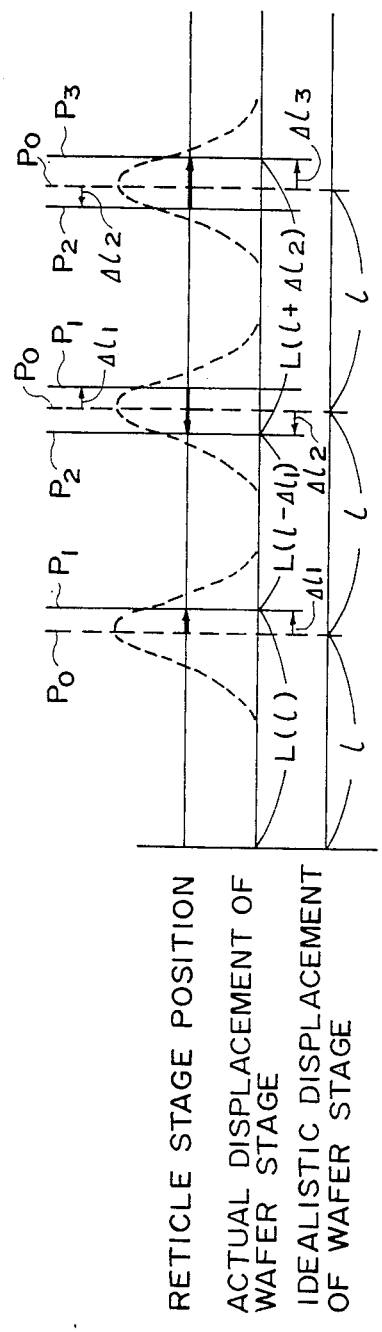

ALIGNMENT AND EXPOSURE APPARATUS

BACKGROUND OF THE INVENTION

This invention relates to an exposure apparatus in which projection of a pattern of a first object onto a second object through an optical system and subsequent stepwise movement of the second object relative to the first object are repeated to thereby repeatedly print the pattern on the second object. More particularly, the invention relates to an exposure apparatus to be used in the manufacture of semiconductor devices such as integrated circuits (ICs), large scaled integrated circuits (LSIs), very large scaled integrated circuits (VLSIs), etc.

In the field of manufacture of semiconductor devices as mentioned above, exposure apparatuses for projecting, at a reduced magnification ratio, a circuit pattern of a reticle onto a wafer through an optical system to thereby print the reductively projected circuit pattern onto the wafer are known. An example is a step-and-repeat type exposure apparatus, called a stepper.

In such exposure apparatus, the circuit pattern printed onto the wafer through one exposure usually occupies only a small area on the wafer corresponding to one or more chips of the semiconductor devices. Therefore, in order to print the circuit pattern of the reticle onto all the sections of the wafer surface, it requires repetition of exposure accompanied with stepwise movement of the wafer relative to the reticle along a plane orthogonal to the optical axis of a projection optical system. Frequently, for each reticle, ten or more repetitions of exposure are necessary.

When, after a first exposure step comprising repetitions of exposure with a first reticle has been made relative to a wafer, a second exposure step with a second reticle is to be made to the same wafer, the circuit pattern formed on the second reticle must be accurately projected onto or overlaid on each of the circuit patterns which have already been printed on the wafer. In order to achieve this, it is desired to effect, for each of the exposures, alignment between the already-printed circuit pattern and the circuit pattern which is currently to be projected onto the wafer, namely alignment between the second reticle and the wafer. As an example of the technique for such alignment, a TTL (through-the-lens) type die-by-die alignment system is known. According to this alignment system, relative positional deviation between the reticle and wafer is detected through the projection optical system every time the stepwise movement of the wafer relative to the reticle is completed. When the relative positional deviation is detected, the positional relation between the reticle and wafer is corrected in accordance with the detected positional deviation and, thereafter, the exposure is effected. Such alignment process assures very precise alignment for each of the exposure operations. Therefore, a higher overlay accuracy for the circuit patterns of different reticles is advantageously attainable over the entire wafer surface.

Such alignment process however involves inconveniences as follows:

That is, according to such alignment process, plural alignment operations are required throughout the exposures of the entire wafer surface relative to the circuit pattern of one reticle. This results in a corresponding decrease in the throughput of the apparatus. Particularly, in the case of die-by-die alignment, plural alignment operations corresponding to the repetitions of exposures are required. It is therefore a significant problem to improve the throughput, in an exposure apparatus employing the alignment process as described above.

SUMMARY OF THE INVENTION

It is accordingly a primary object of the present invention to provide an improved exposure apparatus in which an increased throughput is attainable.

It is a second object of the present invention to provide an improved exposure apparatus in which the time required for the alignment operation is reduced.

It is a third object of the present invention to provide an improved exposure apparatus suitable for the manufacture of semiconductor devices.

Briefly, according to the present invention, there is provided an alignment and exposure apparatus in which sequential operations of pattern projection for projecting a pattern of a first object, at a reduced ratio, onto a second object through an optical system, stepwise movement for moving the second object stepwise relative to the first object, detection for detecting any positional deviation between the first and second objects at a position at which the stepwise movement of the second object is terminated, and correction for correcting the positional relation between the first and second objects on the basis of the detected positional deviation, are repeated relative to the second object to thereby print the patterns onto the second object in a reduced scale. Upon correction of the positional relation between the first and second objects, at least one of the first and second objects is displaced in accordance with the magnitude of the detected positional deviation and/or, upon stepwise movement of the second object, the amount of stepwise movement to be made is corrected in accordance with the detected positional deviation with respect to the position at which the preceding stepwise movement of the second object is terminated. By this, the time required for repetitions of exposures is reduced.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a perspective view showing an exposure apparatus for the manufacture of semiconductor devices, to which apparatus the present invention is applicable.

FIG. 6 shows how FIGS. 6A and 6B are assembled to form a flow chart showing the operation of the exposure apparatus of FIG. 5.

FIGS. 11A-11C illustrate a significant difference between the operation which is in accordance with the FIG. 9 embodiment and the operation which is not in accordance with the FIG. 9 embodiment.

DESCRIPTION OF THE PREFERRED EMBODIMENT

Figure 2A:
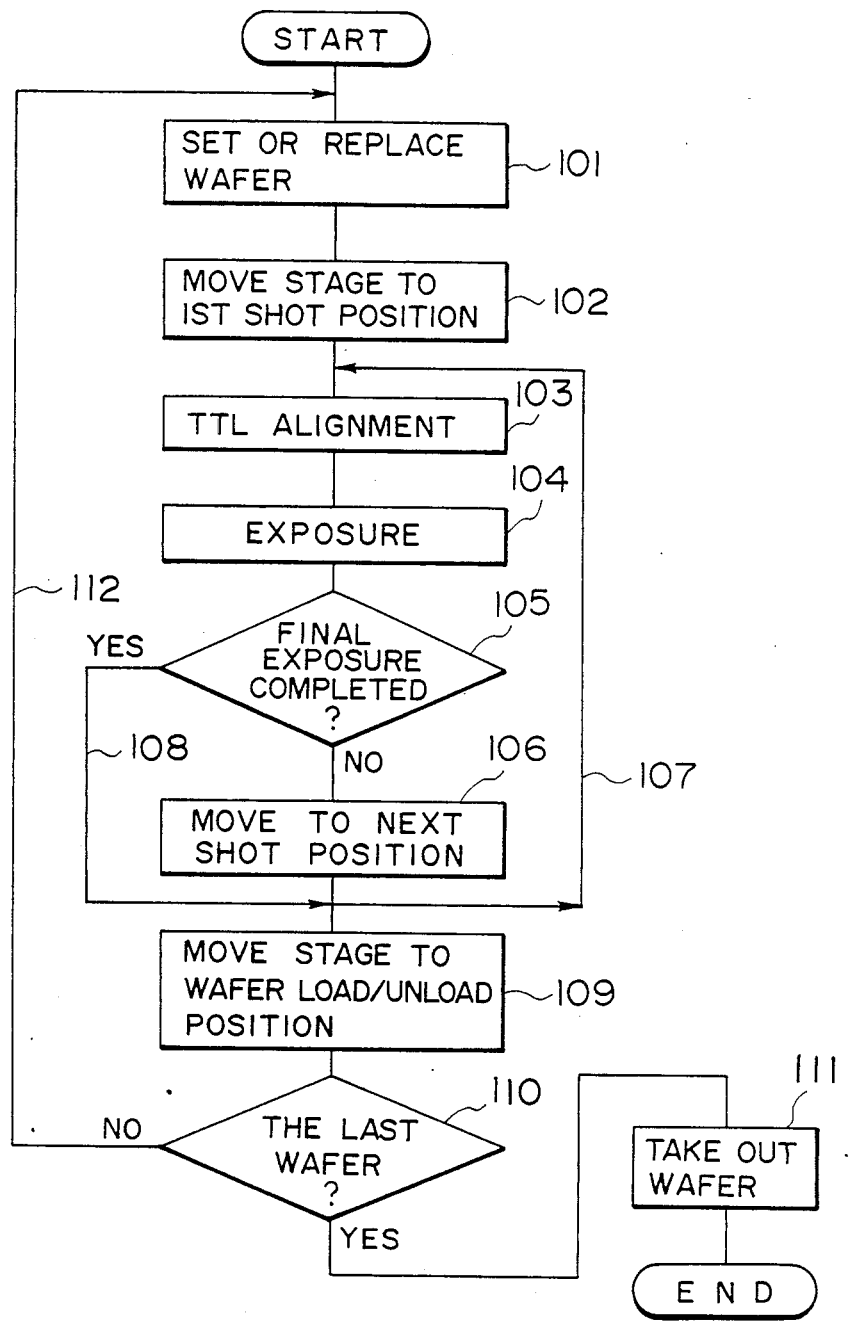
FIGS. 2A and 2B are flow charts, respectively, showing general operation of the exposure apparatus of FIG. 1.

In the following, the invention will be described with reference to exposure apparatuses for the manufacture of semiconductor devices. However, the invention is not limited thereto. Also, in the following description, two orthogonal directions contained in a plane orthogonal to the optical axis of the reduction projection lens will be referred to as "X" and "Y", respectively, and the direction of the optical axis of the reduction projection lens will be referred to as "Z", while the direction of rotation about the direction Z will be referred to as "$\theta$".

Referring first to FIG. 1 showing an exposure apparatus to be used for the manufacture of semiconductor devices, a reticle 1 is carried on a reticle stage 2 which is movable in the directions of X, Y and $\theta$. Disposed beneath the reticle stage 2 is a wafer 4 onto which the circuit pattern formed on the reticle 1 is to be projected by a reduction projection lens 3 at a reduced ratio. The wafer 4 is carried on a wafer stage 5 which is movable in the directions of X, Y and $\theta$. A housing member 6 houses alignment scopes for the TTL alignment and for observation. An objective lens 7 for television (TV) alignment is provided so that an image pickup tube 8 picks up an image for TV prealignment. The exposure apparatus further includes an image pickup tube 9 for observation of the wafer 4 through the reduction projection lens 3, a light source 10 for providing exposure light to illuminate the reticle 1, wafer supplying carriers 11a and 11b, wafer collecting carriers 12a and 12b, a monitoring TV 13 for selectively displaying images picked up by the image pickup tubes 8 and 9, an operation panel 14 having joysticks and switches, etc., a console 15 operationally associated with a cathode ray tube to control the entire apparatus.

The joysticks provided on the operation panel 14 have various functions. For example, they are adapted to control movement of the reticle stage 2 and wafer stage 5 in the directions of X, Y and $\theta$, and the movement of the alignment scopes 6a and 6b in the directions of X and Y, focusing movement thereof (movement in the Z direction) as well as zooming movement thereof. In order to control such operations, a sequence has been preparatively programmed so that an appropriate function is automatically selected at a particular point in the sequence. More specifically, they are adapted to control the movement of the reticle stage 2 and the alignment scopes 6a and 6b, in the stand-by state, while they are adapted to control the movement of the wafer stage 5, after the prealignment or automatic alignment. Corresponding functions are appropriately and automatically selected.

Figure 2B:
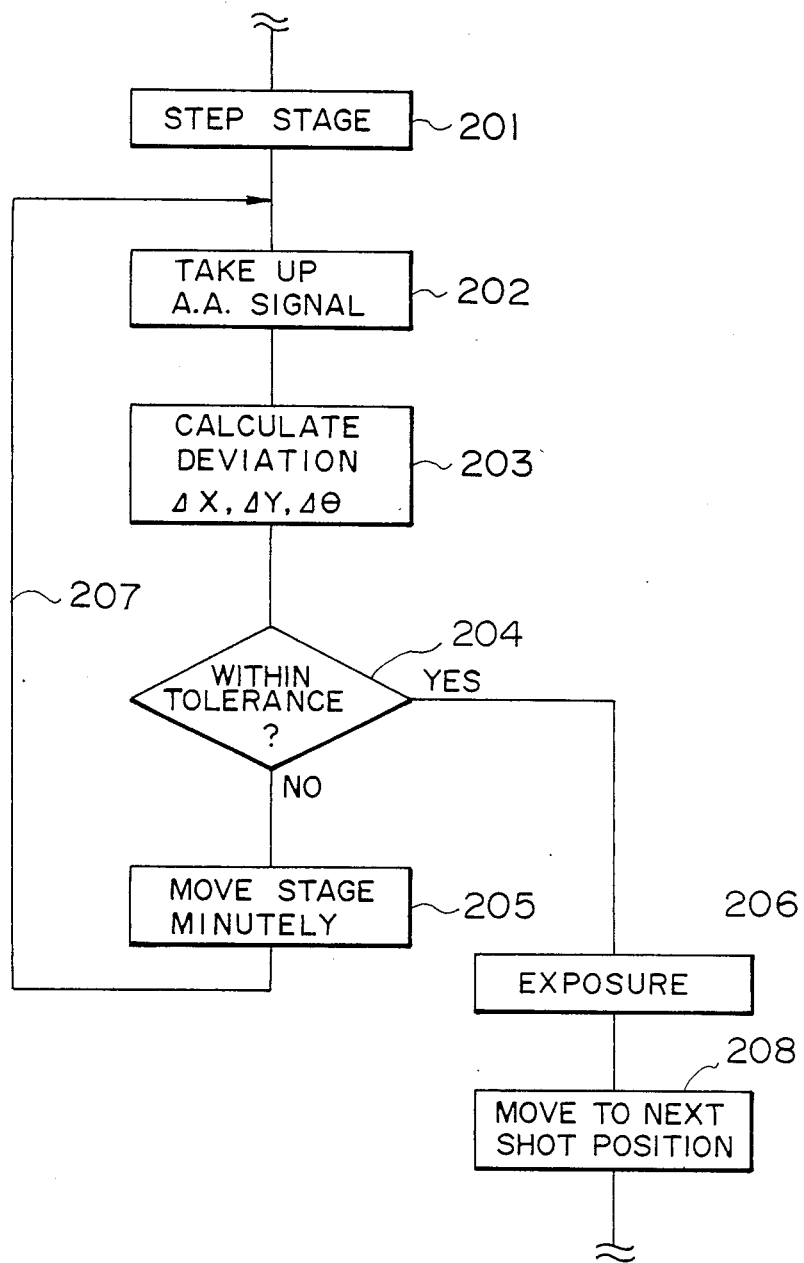

FIGS. 2A and 2B are flow charts, respectively, showing the alignment and exposure operation which will be common to the exposure apparatuses such as shown in FIG. 1. More specifically, FIG. 2A shows the general flow of the alignment and exposure operation, while FIG. 2B shows details of the step 103 of FIG. 2A.

In this type of exposure apparatus, as it will be seen from FIG. 2A, the alignment operation (step 103) and the stepwise movement (step 106) are effected for each exposure operation (which will hereinafter be referred to as "shot") at the step 104. On the other hand, from the viewpoint of throughput which is one of the important features of a manufacturing apparatus, reduction in the time required for the alignment operation is a critical problem because the number of shots for one wafer is increasing with further miniaturization of the integrated circuit and with the enlargement of the size of wafer.

As is shown in FIG. 2B, the alignment operation (step 103) usually involves the following process:

First, the wafer stage 5 is moved stepwise (step 201). Subsequently, the relative positional deviation between the reticle and wafer is detected (steps 202 and 203). Then, whether or not the detected positional deviation is within an allowable tolerance is discriminated (step 204) and, if not within the tolerance, the wafer stage is moved minutely (step 205). These steps are repeated through a loop 207 until the relative positional deviation between the reticle and wafer comes into the tolerance.

An exposure apparatus according to a first embodiment of the present invention will now be described with reference to FIG. 3.

Figure 3:
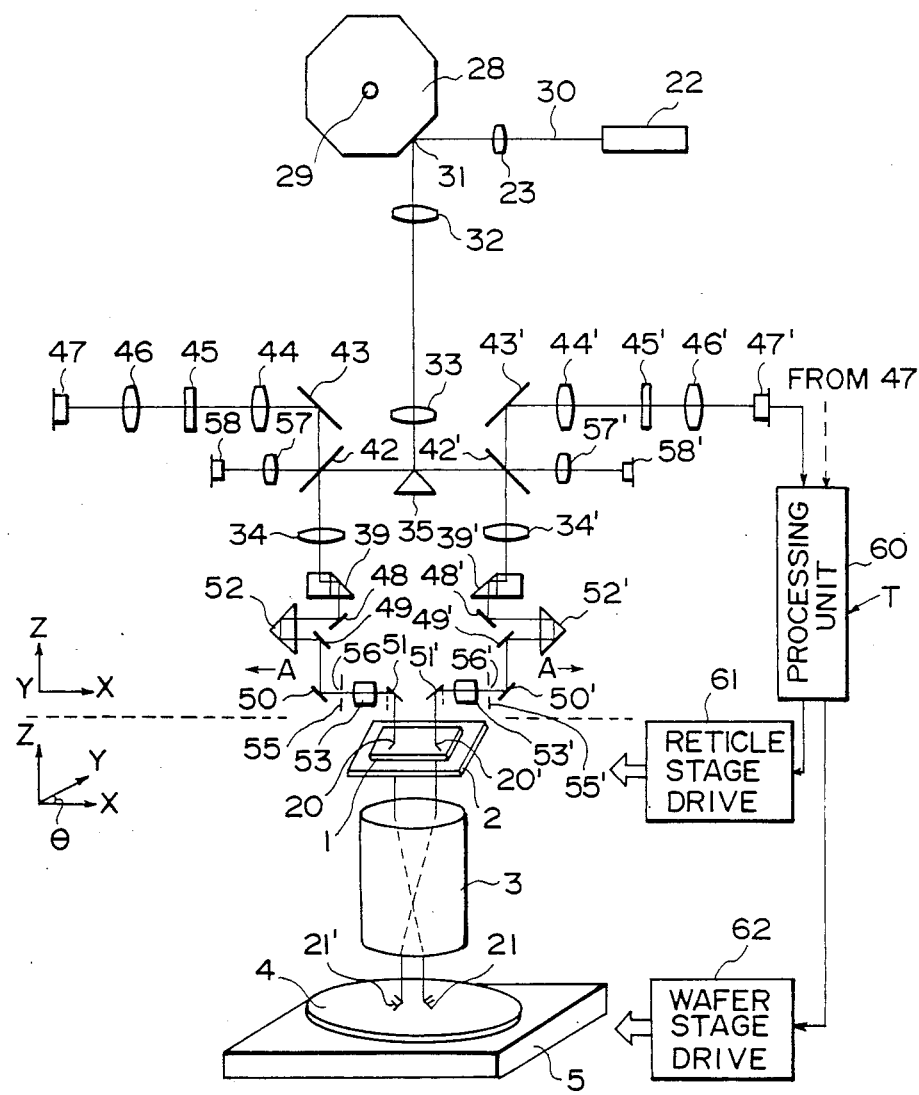
FIG. 3 is a schematic and diagrammatic view showing an exposure apparatus according to a first embodiment of the present invention.

As is shown in FIG. 3, a reticle 1 having formed thereon an integrated circuit pattern (not shown) and alignment marks 20 and 20' is held by a reticle stage 2 by vacuum suction. Denoted by reference numeral 3 is a reduction projection lens for projecting the circuit pattern of a reticle onto a wafer 4 having a photosensitive layer and alignment marks 21 and 21'. The wafer 4 is carried by a wafer stage 5 which holds the wafer 4 by vacuum suction. Both the reticle stage 2 and the wafer stage 5 are adapted to be driven by a reticle stage driving unit 61 and a wafer stage driving unit 62, respectively, in the directions of X, Y and $\theta$. The wafer stage 5 is necessarily heavy because it has to carry thereon a heavy wafer chuck and also it must be provided with a mechanism for effecting the stepwise movement of the wafer. As compared therewith, the reticle stage 2 can be light in weight and small in inertia. Therefore, precise positioning of the reticle stage 2 is easy.

Only for the sake of convenience, one set of alignment marks 21 and 21' are illustrated for the wafer 4. In the case of die-by-die alignment, however, the alignment operation is effected for each of the chip areas on the wafer 4, so that plural sets of such alignment marks as at 21 and 21' corresponding to the number of shots are actually formed on the wafer 4, particularly on the scribe lines on the wafer.

In the present embodiment, the dimensional relation between each of the alignment marks 20 and 20' on the reticle 1 and each of the alignment marks 21 and 21' on the wafer 4 is such that the size of the alignment mark 20 or 20' on the reticle 1 divided by the size of the alignment mark 21 and 21' on the wafer 4 becomes equal to the reduction ratio of the projection lens 3.

Denoted by a reference numeral 28 is a polygonal mirror which is rotatable about a rotational shaft 29. A laser source 22 emits a laser beam 30 which is focused by a lens 23 onto a point 31 on the surface of the polygonal mirror 28.

Figure 7:
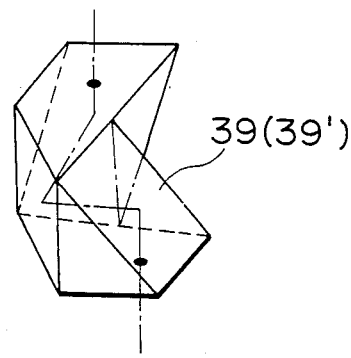
FIG. 7 is a perspective view showing one of the major elements of the scanning optical system.

The exposure apparatus further includes relay lenses 32, 33 and 34, and a triangular prism 35 having its apex coincident with the common optial axis of the lenses 32 and 33. Thus, the prism 35 is effective to divide each scanning operation by the laser beam 30 scanningly deflected by the polygonal mirror 28 into the first and second halves, i.e. the right-hand side half and the left-hand side half. A prism block 39 is provided to convert the X direction scanning of the laser beam 30 into the Y direction scanning and has a construction such as illustrated in FIG. 7. A half mirror 42 is provided to define a photoelectric detecting system comprising a mirror 43, a lens 44, a spatial filter 45, a condenser lens 46 and a photodetector 47. The output of the photodetector 47 is supplied to a processing unit 60 for effecting a predetermined operation which will be described later. In this processing unit 60, a threshold T adapted to minimize the time required for the alignment is stored. The threshold T is determined while taking into account the reduction ratio of the projection lens 3 and the peculiarities of the stages 2 and 5 themselves.

Disposed behind the prism block 39 and along the optical axis are total reflection mirrors 48, 49, 50 and 51, a prism 52 and an f-8 objective lens 53.

The exposure apparatus further includes a condenser lens 57 and a photodetector 58 for detecting a synchronization signal. A portion of the laser beam incident on the half mirror 42 passes therethrough and enters into the condenser lens 57. By the condenser lens 57, the portion of the laser beam is converged and is incident on the photodetector 58. Thus, the photodetector 58 is effective to detect the originating point and terminating point of the laser beam scanning.

It will be seen from the drawing that the signal detecting device of the present embodiment comprises left-hand side and right-hand side signal detecting systems which are fully symmetric with each other. Hereinafter the signal detecting system including elements designated by reference numerals with primes will be referred to as "right-hand side signal detecting system", while the signal detecting system including elements denoted by reference numerals without prime will be referred to as "left-hand side signal detecting system". In the right-hand side signal detecting system, elements corresponding to those in the left-hand side signal detecting system are denoted by corresponding reference numerals with primes.

The relay lenses 32-34 form a deflection origin of the polygonal mirror 28 at a position of a pupil 56 of a stop 55 for the objective lens 53. As a result, the reticle 1 surface and the wafer 4 surface are scanned by the laser beam of sheet-like shape or spot like shape with the rotation of the polygonal mirror 28.

In this objective lens system, all the objective lens 53, stop 55, mirror 51 and prism 52 are adapted to be moved by an unshown driving mechanism in the directions of X and Y, so that the measuring points on the reticle 1 and wafer 4 can be changed intentionally. For example, the displacement in the X direction can be achieved by the movement of the mirror 51, objective lens 53 and stop 55 in the direction of arrow A accompanied with the movement of the prism 52 in the same direction of arrow A but through a distance which is equal to half of the amount of movement of the mirror 51, for maintaining the optical path length constant. On the other hand, the displacement in the Y direction is achieved by displacing the whole of the position detecting optical sytem in the Y direction. By this, the alignment mark detection can be achieved for any cases, e.g. a case where separate reticles have their alignment marks located at different position, or a case where some reticle is provided with reticle setting marks in addition to the alignment marks.

In operation, the laser beam 30 emitted from the laser source 22 is scanningly deflected in the X direction by the rotating polygonal mirror 28 and is divided by the prism 35 into two, i.e. the first and second halves. Each of the divided laser beams is incident on the prism block 39 or 39' so that the X direction scan is converted into the Y direction scan. Each of the laser beams emerging from the prism block 39 and 39' is incident on the alignment mark 20 (or 20') of the reticle 1 and on the alignment mark 21 (or 21') of the wafer 4 so that they are scanned by the scanning laser beam. Before such laser beam scanning, the reticle 1 and wafer 4 are prealigned with each other so that the alignment marks 20 and 21 are approximately aligned with the alignment marks 20' and 21', respectively.

The scatteringly reflected light from the alignment marks 20 and 21 and from the alignment marks 20' and 21' are transmitted through the half mirrors 42 and 42', respectively, and reflected by the mirrors 43 and 43', respectively, so that they are incident on the photodetectors 47 and 47', respectively. The processing unit 60 includes a memory and is adapted to effect a predetermined operation on the basis of the outputs of the photodetectors 47 and 47' stored in the memory.

In an ordinary exposure apparatus, correction of the relative positional deviation between the reticle 1 and wafer 4 at the step 205 shown in FIG. 2B is usually achieved by moving only one of the reticle stage 2 and the wafer stage 5. For example, U.S. Pat. No. 4,057,347 issued Nov. 8, 1977 discloses that the positional deviation between the mask and wafer after completion of the stepwise movement of the wafer stage is corrected by moving the mask stage. This involves however significant inconveniences such as follows:

That is, if the amount of positional deviation is smaller than the minimum displaceable length of the reticle stage or wafer stage, it requires an increasing number of repetitions of loop 107 (FIG. 2A) for reducing the positional deviation to a level within an allowable range, whereby the time required for the alignment is prolonged. If, on the other hand, the minimum displaceable length of each stage is made small, a longer time is required to move the stage to correct a relatively large amount of positional deviation, resulting in increased time for the alignment. In both the cases, the throughput of the apparatus disadvantageously decreases.

Figure 4:
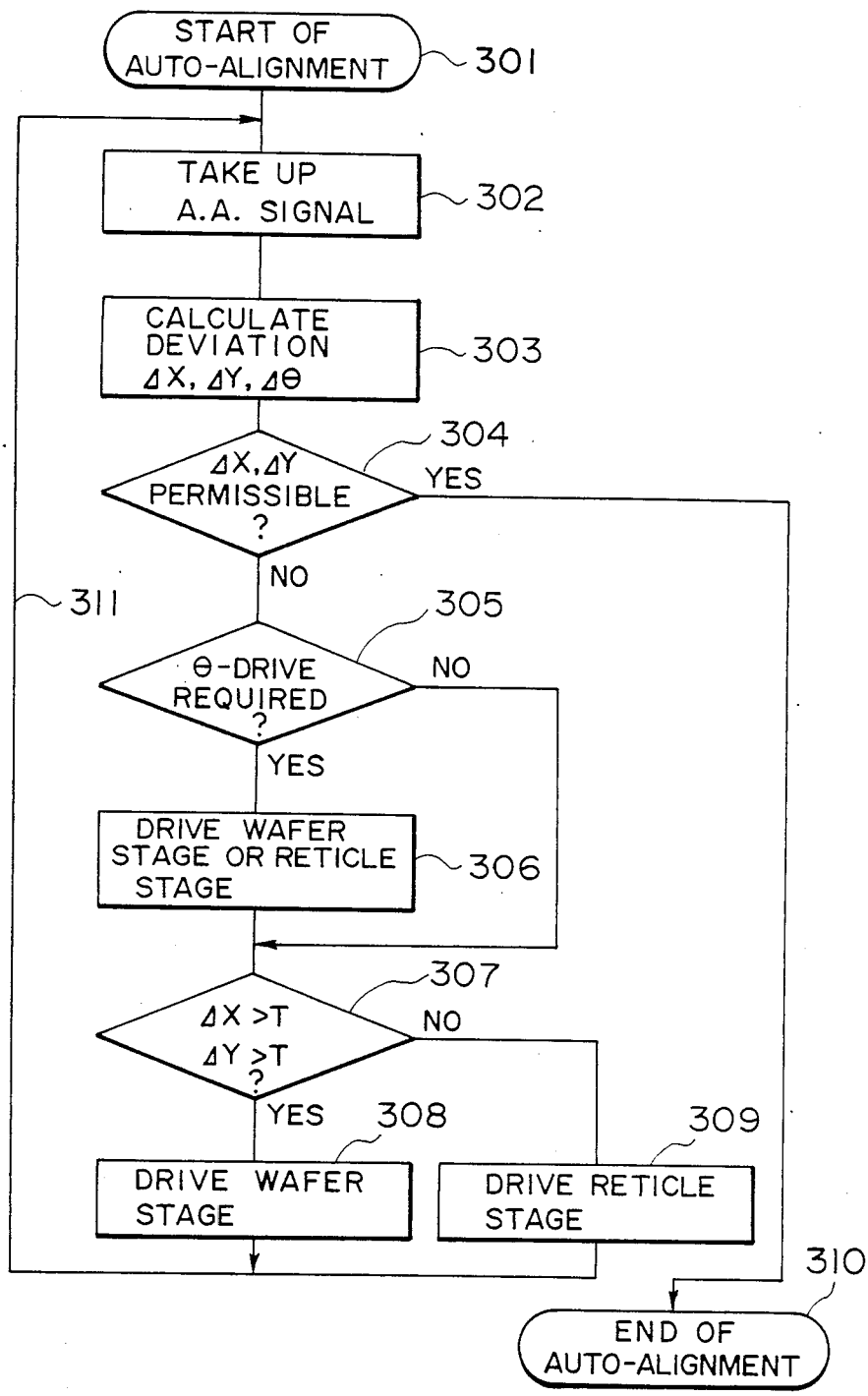
FIG. 4 is a flow chart showing the operation of the exposure apparatus of FIG. 3.

Such inconveniences as described above are removed by an exposure apparatus according to the embodiment shown in FIGS. 3 and 4. In a reduction projection type exposure apparatus such as shown in FIG. 3, the relative positional deviation between the reticle 1 and wafer 4 which can be observed on the reticle 1 side differs in magnitude from that which can be observed on the wafer 4 side, by such a degree that corresponds to the reduction ratio of the projection lens 3. The present invention with reference to the FIG. 3 embodiment aims at introducing such feature into the alignment operation. More specifically, the exposure apparatus according to the FIG. 3 embodiment is arranged such that, if the relative positional deviation between the reticle 1 and wafer 4 is greater than a predetermined amount, at least the wafer stage 5 is moved to correct the positional deviation, while if, on the other hand, the relative positional deviation is smaller than the predetermined amount, only the reticle stage 2 is driven. By this, reduction in the time for the alignment operation is assured with high accuracies in the alignment being maintained.

Details of the operation of FIG. 3 embodiment will now be described.

After completion of one shot relative to one of the areas on the wafer 4, the wafer stage 5 is moved stepwise so that the next area to be exposed on the wafer 4 is positioned in the projection field of the projection lens 3. Subsequently, the auto-alignment operation is initiated (step 301). Then, the laser beam 30 is scanningly deflected by the polygonal mirror 28 and the scattered light from the alignment marks 20, 20' on the reticle 1 and the alignment marks 21, 21' on the wafer 4 is received by each of the photodetectors 47 and 47', whereby an auto-alignment signal (which will hereinafter be referred to as "A.A. signal") is taken up or received (step 302). The A.A. signal contains information on the deviations $\Delta XL$ and $\Delta YL$, on the reticle 1 surface, between the alignment marks 20 and 21 with respect to the directions of X and Y, respectively, and information on the deviations $\Delta XR$ and $\Delta YR$ between the alignment marks 20' and 21' with respect to the directions of X and Y. Subsequently, the relative positional deviations $\Delta X$, $\Delta Y$ and $\Delta \theta$ between the reticle 1 and wafer 4 with respect to the directions of X, Y and $\theta$ is calculated (step 303). Each of the deviations $\Delta X$, $\Delta Y$ and $\Delta \theta$ can be obtained by the following equations:

$$\Delta X = (\Delta XL + \Delta XR)/2 \qquad (1)$$

$$\Delta Y = (\Delta YL + \Delta YR)/2 \qquad (2)$$

$$\Delta \theta = (\Delta YR - \Delta YL)/(XR - XL) \qquad (3)$$

wherein XL and XR are the positions of the left-hand side mark 20 and right-hand side mark 20' with respect to the center of the reticle 1, and (XR−XL) is the distance between these marks.

Subsequently, whether or hot both the deviations $\Delta X$ and $\Delta Y$ are within predetermined allowable ranges, respectively, is discriminated (step 304) and, if not within the permissible ranges, the sequence proceeds to step 305. At the step 305, whether or not the deviation $\Delta \theta$ is within a predetermined allowable range is discriminated. If the deviation $\Delta \theta$ is not within the allowable range, the reticle stage 2 or wafer stage 5 is driven by the reticle stage driving unit 61 or wafer stage driving unit 62 (step 306). Thus the sequence proceeds to step 307. If the above deviation $\Delta \theta$ is within the permissible range, the step 306 is passed by so that the sequence proceeds directly to the step 307.

At the step 307, the deviations $\Delta X$ and $\Delta Y$ are compared with the threshold T which has preparatively stored in the processing unit 60. As described in the foregoing, the threshold T has been determined to minimize the time required for the alignment operation, while taking into account the peculiarities, on the movement, of the reticle stage 2 and wafer stage 5 themselves (e.g. dynamic and static characteristics of the stage, characteristics of the driving system, resolution in the feeding, etc.). Since, in the exposure apparatus of reduction projection type, the pattern projected onto the wafer 4 is reduced both in the directions of X and Y as compared with the original (the pattern of the reticle 1) in correspondence to the reduction ratio of the projection lens, the arrangement of displacing the reticle stage 2 enables adjustment which is relatively fine as compared with the adjustment by displacing the wafer stage 5, by a degree corresponding to the reduction ratio. Further, when the deviation is detected on the reticle surface side and if the detected deviation is corrected or compensated for by displacing the wafer stage 5, the amount of displacement is reduced. Since the deviation $\Delta \theta$ is not related to the reduction ratio, either one of the reticle stage 2 and wafer stage 5 may be driven at the steps 305 and 306.

If, at the step 307, any one of the deviations $\Delta X$ and $\Delta Y$ is higher than the threshold T, the sequence proceeds to step 308 whereat the wafer stage 5 is driven by the wafer stage driving unit 62 to effect relatively coarse adjustment between the reticle 1 and wafer 4. If, on the other hand, each of the deviations $\Delta X$ and $\Delta Y$ is lower than the threshold T, the sequence proceeds to step 309 whereat the reticle stage 2 is driven by the reticle stage driving unit 61, whereby a relatively fine adjustment between the reticle 1 and wafer 4 is effected.

In any case of relatively coarse adjustment and relatively fine adjustment, the sequence returns via a loop 311 to the steps 302 and 303 for detecting the relative positional deviation between the reticle 1 and wafer 4. In this manner, the loop 311 proceeding from step 302 to step 309 is repeated until the relative positional deviation comes into the allowable range. When the positional deviation comes into the allowable range, the sequence follows a branch from the step 304 whereby the alignment is completed (step 310).

While in the present embodiment a selected one of the reticle stage 2 and wafer stage 5 is driven to correct the positional deviation, both the stages may be simultaneously driven until the threshold T is reached. In such case, only the reticle stage is driven after the positional deviation comes into the relatively fine adjustment range (the range not greater than the threshold). Such arrangement enables further reduction in the alignment time.

In accordance with the present embodiment, the reticle stage 2 and wafer stage 5 are selectively driven. This maintains high accuracies without making the minimum displaceable length of each stage smaller and assures reduction in the time for the alignment operation, which advantageously improves the throughput of the apparatus.

An exposure apparatus according to another embodiment of the present invention will now be described with reference to FIGS. 5 and 6.

In summary, the present embodiment is based on such finding that the amount of deviation with respect to one of the chip areas is substantially or approximately equal to those with respect to the adjacent chip areas. In accordance with such finding, the exposure apparatus according to the present embodiment is arranged such that, on the basis of the amount of deviation detected during the alignment operation for one of the shots, the amount of stepwise movement for the succeeding shot is controlled, to thereby minimize the amount of initial positional deviation at the succeeding shot and thus minimize the time required for the alignment operation for the succeeding shot. In FIG. 5, the same reference numerals as in the foregoing embodiment are assigned to corresponding elements.

Figure 5:
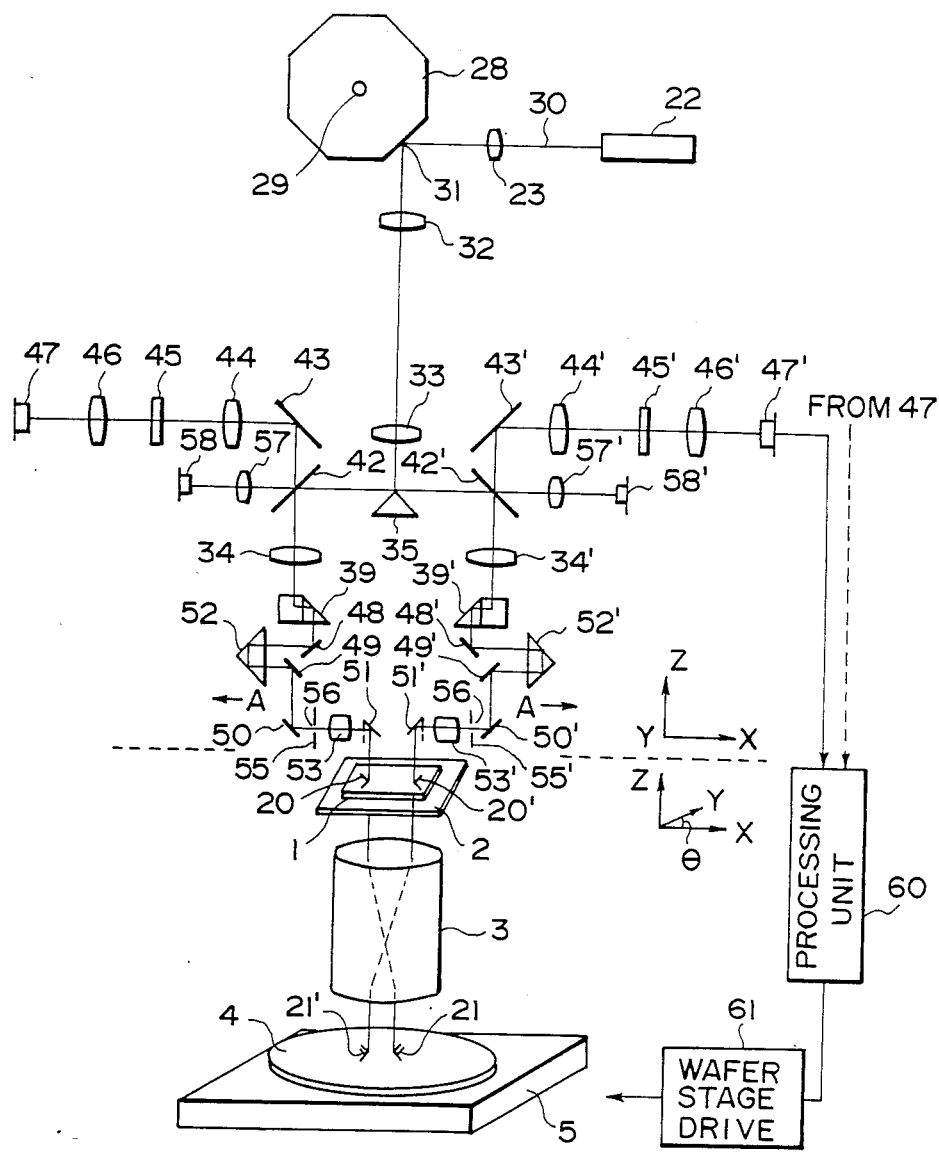
FIG. 5 is a schematic and diagrammatic view showing an exposure apparatus according to another embodiment of the present invention.
Figure 6B:
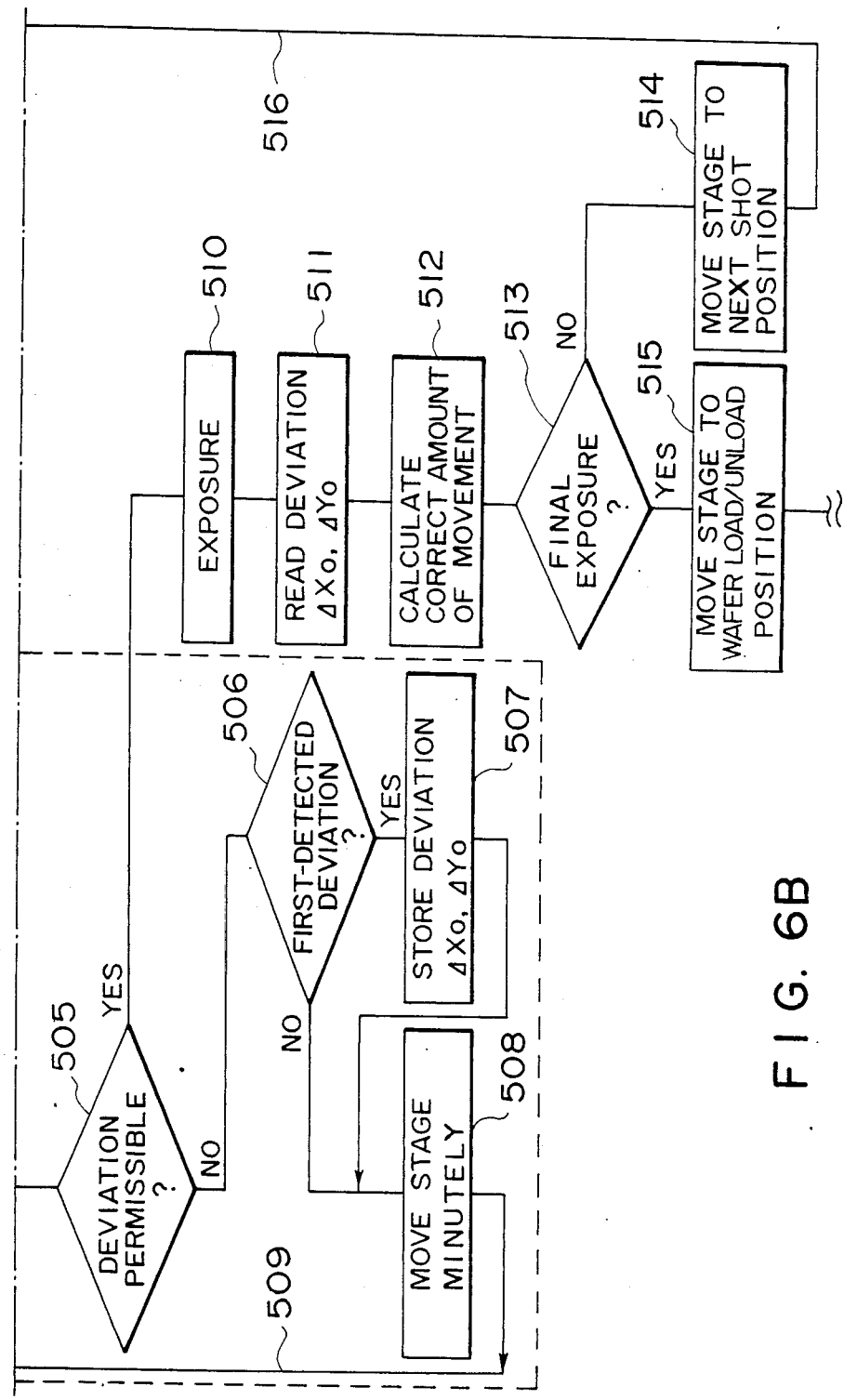

As is shown in FIG. 5, the exposure apparatus includes a reticle stage 2 for holding a reticle 1 by vacuum suction, and a wafer stage 5 for holding a wafer 4 by vacuum suction. The wafer stage 5 is adapted to be moved by a wafer stage driving unit 61 in the directions of X, Y and $\theta$. After completion of each shot, the wafer stage 5 is moved stepwise so that different areas on the wafer 4 are sequentially positioned in the projection field of a projection lens 3 having an equal or reduced magnification. The wafer stage 5 is also adapted to be moved in the directions of X, Y and $\theta$ by the wafer stage driving unit 61 in accordance with the amount of positional deviation detected by a processing unit 60 upon the aligment operation for the reticle 1 and wafer 4 after the stepwise movement of the wafer stage 5. At the time of position correction, the reticle 1 is maintained at its initial position, in the present embodiment. However, as in the foregoing embodiment, the reticle 1 may be moved through the reticle stage 2 during the alignment operation. Since the other portion of the structure of the present embodiment is essentially the same as that in the foregoing embodiment, the description thereof will be omitted here only for the sake of simplicity.

The operation of the present embodiment on the basis of the output of the processing unit 60 will now be described with reference to FIG. 6.

When the wafer stage 5 is loaded with the wafer 4 (step 501), the wafer stage 5 is moved so that the first area to be exposed on the wafer 4 is positioned in the projection field of the projection lens 3 (step 502). Subsequently, an A.A. signal for the auto-alignment is taken up by means of photodetectors 47 and 47' (step 503) and thereafter the positional deviations $\Delta X$, $\Delta Y$ and $\Delta\theta$ between the reticle 1 and wafer 4 are calculated by the processing unit 60 on the basis of the detected A.A. signal (step 504). The calculation is essentially the same as that in the foregoing embodiment.

Then, whether or not each of the deviations $\Delta X$, $\Delta Y$ and $\Delta\theta$ is within an allowable range is discriminated (step 505) and, if not, the sequence proceeds to step 508 through step 506 or steps 506 and 507 whereat the processing unit 60 supplies an instruction signal to the wafer stage driving unit 61 to move the wafer stage 5 minutely to correct the deviations. This minute movement of the wafer stage 5 is repeated via a loop 509 until the deviation comes into the permissible range.

On the other hand, step 506 is provided to discriminate whether or not the deviations $\Delta X$ and $\Delta Y$ detected by the step 504 are the first-detected deviations with respect to each of the areas, to be exposed on the wafer 4 and only the first-detected deviations $\Delta X_0$ and $\Delta Y_0$ are stored (step 507). Namely, only the first-detected values $\Delta X_0$ and $\Delta Y_0$ are stored, while the subsequently-detected values $\Delta X_1$, $\Delta Y_1$; $\Delta X_2$, $\Delta Y_2$; ... $\Delta X_n$, $\Delta Y_n$ are neglected.

When the completion of alignment is detected at the step 505, the exposure operation is effected (step 510). After the exposure, the wafer stage 5 is moved stepwise so that the succeeding shot area is positioned in the projection field of the projection lens 3. The amount of this stepwise movement will now be described in detail.

Major factors for the relative positional deviation between the reticle 1 and wafer 4 are:
(1) Accuracies in the wafer stage movement;
(2) Magnification error and distortion in the pattern projection during the preceding exposure step using the preceding reticle; and
(3) Expansion or contraction of wafer and/or reticle.

Figure 8:
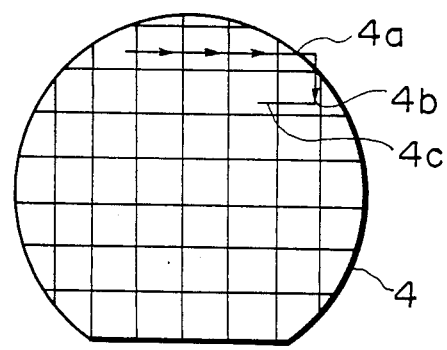
FIG. 8 is a plan view schematically showing the stepwise movement of the wafer.

The positional deviation is not constant with respect to different areas, to be exposed, on the same wafer. It has been however found that, if, for example, the exposure of the wafer 4 is effected in the order as denoted by arrows in FIG. 8, the positional deviation with respect to an area 4b is substantially or approximately equal to that of each of the adjacent areas, e.g. such as 4a and 4c. On the basis of such finding, the exposure apparatus according to the present embodiment is arranged such that, if for example the exposure of the area 4b has just been finished, the stepwise movement of the stage 5 for the succeeding shot of the area 4c is controlled on the basis of the deviations $\Delta X$ and $\Delta Y$ detected during the alignment with respect to the area 4b. Particularly, in accordance with the present embodiment, the first-detected values $\Delta X_0$ and $\Delta Y_0$ are selected to control the amount of subsequent stepwise movement. This is because these first-detected values will appear, substantially as they are, in the succeeding exposure due to the above-described factors (1)-(3).

Thus, after completion of exposure (step 510), only the first-detected positional deviations $\Delta X_0$ and $\Delta Y_0$ obtained during the alignment with respect to the preceding shot and stored by the step 507 are read out (step 511). Subsequently, the deviations $\Delta X_0$ and $\Delta Y_0$ are added to a predetermined amount of stepwise movement $X_0$, $Y_0$ which is in accordance with the area on the wafer 4 to be exposed by the succeeding shot, whereby the amount of stepwise movement for the shot of the succeeding area is calculated. This calculation may of course be effected during the current shot of exposure. In accordance with the calculated amount of movement, the wafer stage 5 is moved stepwise (step 514) and the alignment operation for the succeeding shot of exposure is effected (step 503). During this alignment operation, the first-detected deviations are stored (step 507). In this mahner, alignment, exposure and corrected stepwise movement are effected for each of the areas to be exposed. By this, the positional deviation at the initiation of the alignment operation for each of the areas to be exposed is significantly decreased so that the time required for the alignment is reduced.

When the completion of exposure relative to the whole surface of the wafer is detected (step 513), the wafer 4 is taken out (step 515) and another wafer is supplied. Thus, the operation is re-started with the step 501.

In accordance with the present embodiment, the stepwise movement for each shot is corrected or controlled, whereby the positional deviation between the reticle 1 and wafer 4 with respect to each of the areas to be exposed on the wafer 4 is minimized after the wafer 4 is moved stepwise. As a result, the time required for the aligment is reduced and, therefore, the throughput of the apparatus is improved.

An exposure apparatus according to a further embodiment of the present invention will now be described with reference to FIGS. 9 and 10. Briefly, the present embodiment provides further improvements over the foregoing embodiments. In other words, the present embodiment depends on the foregoing embodiments in that the alignment between the reticle 1 and wafer 4 with respect to each of the areas to be exposed on the wafer 4 is achieved by moving, as required, at least one of the reticle stage 2 and wafer stage 5 and in that the amount of stepwise movement of the wafer stage 5 is corrected or controlled in accordance with the positional deviation between the reticle 1 and wafer 4 which has been detected during the alignment operation for the preceding shot of exposure.

In summary, the invention with reference to the present embodiment is based on the following finding:

If, in such exposure apparatus as described above and when the wafer stage is moved stepwise, the reticle is held at a position whereat it is in correct alignment with the wafer with reference to the preceding shot, the initial positional deviation between the reticle and the wafer when the stepwise movement of the wafer stage is just completed will be probably larger. This is illustrated in FIG. 11C. As will be seen from this Figure, if, upon the first stepwise movement of the wafer stage 5 for a particular idealistic displacement 1 (small letter of L), the actual displacement of the wafer stage 5 is L(1) so that an error $\Delta l_1$ is caused, the reticle stage 2 is moved from the reference position $P_0$ to a position $P_1$ to correct the error $\Delta l_1$. Upon the succeeding stepwise movement, an instruction signal is applied to the driving unit to cause the wafer stage 5 to move through a distance $(1 - \Delta l_1)$. If, however, the actual displacement of the wafer stage 5 in response to this instruction signal is $L(1 - \Delta l_1)$ so that an error $\Delta l_2$ is caused, the reticle stage 2 has to be moved from the position $P_1$ to a position $P_2$ in order to achieve alignment between the reticle and wafer. In other words, the error $\Delta l_1 + \Delta l_2$ must be corrected. Since the terminating point of the stepwise movement of the wafer stage 5 fluctuates in accordance with the normal or Gaussian distribution with respect to the reference position $P_0$, this is an inevitable problem.

On the basis of such finding, the exposure apparatus according to the present embodiment is arranged such that the reticle 1 is returned to the reference position $P_0$ for each stepwise movement of the wafer stage 5, to thereby further reduce the aligment time and further improve the throughput of the apparatus. This will now be described in more detail.

Figure 9:
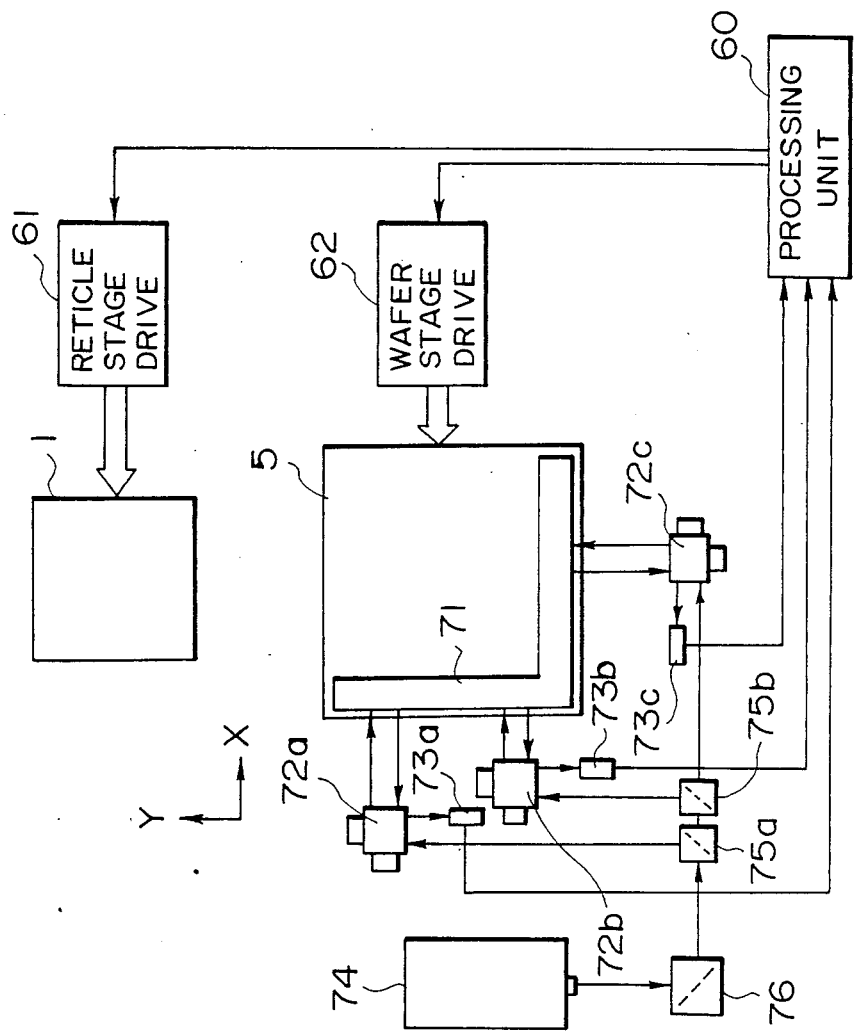
FIG. 9 is a schematic and diagrammatic view showing an exposure apparatus according to a further embodiment of the present invention.
Figure 10:
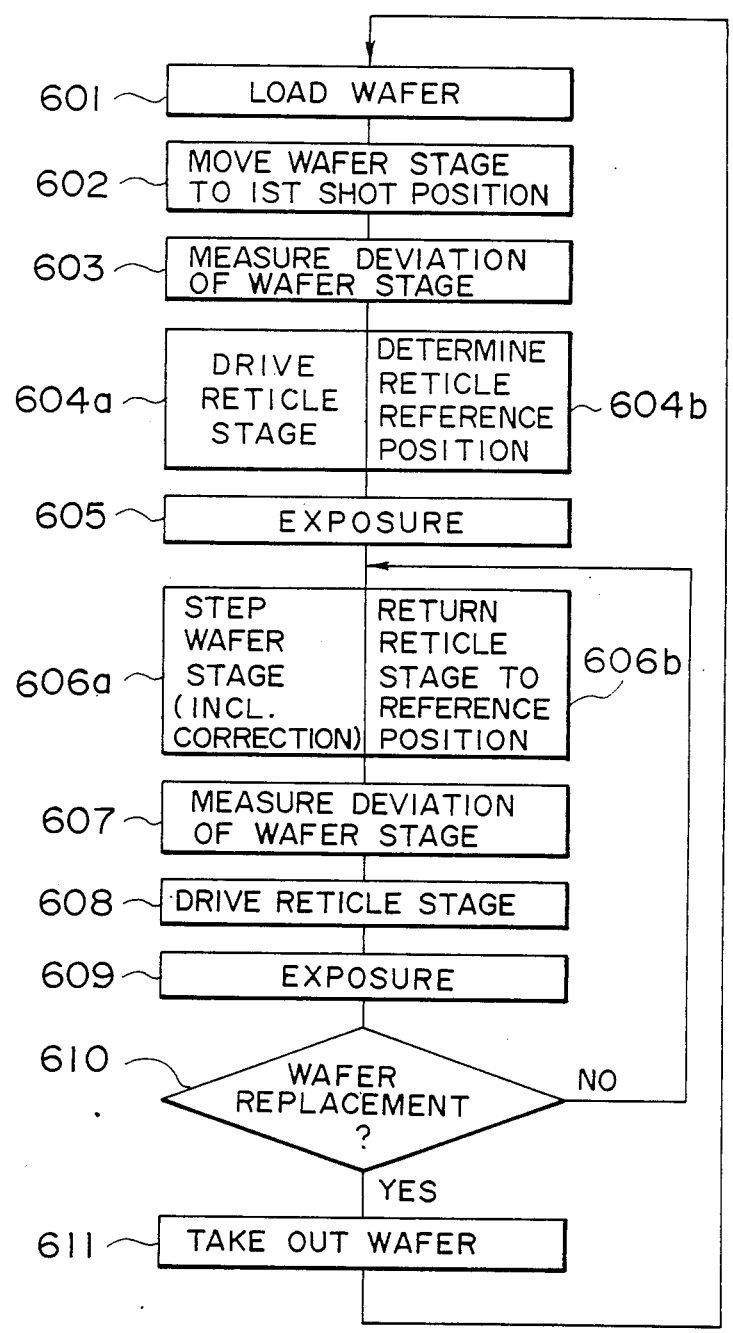
FIG. 10 is a flow chart showing the operation of the exposure apparatus of FIG. 9.

In FIG. 9, the wafer stage 5 is moved stepwise, for each shot of exposure, to a predetermined position by a wafer stage driving unit 62. When the wafer stage 5 has stopped moving, the position thereof is detected by laser interferometers 72a, 72b and 72c. That is, the laser interferometers 72a, 72b and 72c measure the movement of the wafer stage 5 in X and Y co-ordinates and rotational deviation in $\theta$ direction, in co-operation with a reflection mirror 71 having mirror surfaces disposed at a right angle relative to each other. Denoted by reference numeral 74 is a laser head for emitting a laser beam. The laser beam emitted from the laser head 74 is deflected by a beam bender 76 and is then split by beam splitters 75a and 75b.

The operation of the present embodiment particularly on the basis of the output of a processing unit 60 will now be described with reference to the flow chart shown in FIG. 10. As described in the foregoing, the wafer exposure for the manufacture of semiconductor devices includes ten or more repetitions of pattern superposition with the use of corresponding number of separate reticles. This requires alignment, for each of the shots for the same wafer, between the reticle pattern which is to be currently printed on a particular area of the wafer with the pattern which has already been printed on the particular area of the wafer by the preceding shot using the preceding reticle. In other words, on the first reticle pattern which has already been printed on the wafer during the first exposure process, the subsequent reticle patterns must be accurately overlaid.

First, a wafer 4 is supplied to a wafer stage 5 (step 601) and, then, the wafer stage 5 is moved to the first shot position (step 602). When the wafer stage 5 reaches the first shot position, the positional deviation of the wafer stage 5 is measured by the laser interferometers 72a-72c shown in FIG. 9 (step 603). Alternatively, the measurement may be effected by using the alignment marks on the reticle 1 and wafer 4 as in the foregoing embodiments.

Subsequently, the reticle stage 2 is moved by a reticle stage driving unit 61 (step 604a) to correct the positional deviation measured at the step 603, whereby the auto-alignment with respect to the first shot is completed. Simultaneously therewith, the position of the reticle stage 2 at this time is stored into a memory (step 604b). By this, the reference position $P_0$ of the reticle stage 2 is determined. Thereafter, the exposure is effected (step 605) and the first shot is finished.

The exposure of the first shot is followed by alignment and exposure relative to the second shot. At step 606a, the wafer stage 5 is moved stepwise to the second shot position. It is to be noted that, for the stepwise movement with respect to the second shot, correction at step 606a is not effected. It is also to be noted that, at the time of stepwise movement of the wafer stage 5 for the second shot, the reticle stage 2 is at the alignment completion position, i.e. the reference position $P_0$, so that operation for returning the reticle stage 2 to the reference position $P_0$ at step 606b is not effected. When the wafer stage 5 reaches the second shot position, the positional deviation with respect to the second shot position is measured by the laser interferometers 22a-22b or by using the alignment marks on the reticle 1 and wafer 4 (step 607). Subsequently, the reticle stage 2 is moved to correct the positional deviation (step 608), whereby the alignment with respect to the second shot is completed. Thereafter, the exposure of the second shot is effected (step 609).

Subsequently, whether or not a predetermined number of shots of exposures are finished is discriminated (step 610) and, if so, the wafer 4 is taken out (step 611) and another wafer 4 is supplied (step 601).

If the predetermined number of shots are not yet finished, the sequence returns to steps 606a and 606b whereby alignment and exposure for the succeeding shots are continued. That is, the wafer stage 4 is moved stepwise through a distance for compensating for the positional deviation which has been measured at step 607 with respect to the preceding shot (step 606a). Simultaneously therewith, the reticle stage 2 is returned to the reference position $P_0$ (step 606b). The subsequent operation follows in the manner as described above.

Figure 11A:
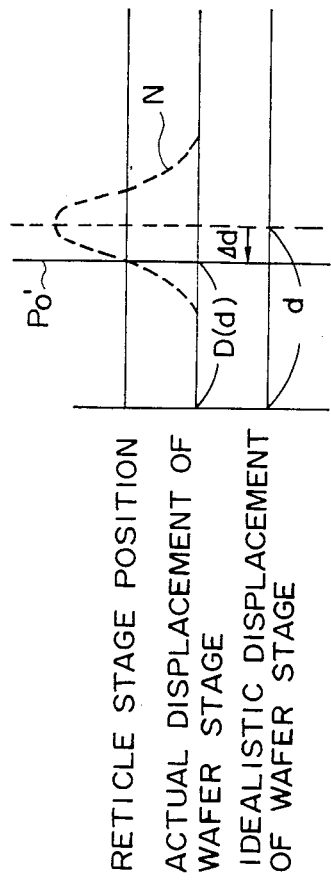

The time required for the alignment operation according to the present embodiment will now be described in more detail with reference to FIGS. 11A-11C. FIG. 11A illustrates movement of the reticle stage 2 and wafer stage 5 for the first shot. With respect to the distance to the first shot position from the position whereat the wafer 4 has actually been loaded on the wafer stage 5, the actual displacement or amount of movement D(d) of the wafer stage 5 fluctuates across the terminal point of the intended and idealistic displacement (amount of movement) d of the wafer stage 5, so that a normal distribution N denoted by a broken line in FIG. 11A is obtainable. In accordance with the present embodiment, the position $P_0'$ of the reticle stage 2 upon completion of the alignment for the first shot is selected as the reference position $P_0$ of the reticle stage 2 for each of the shots after the first shot, particularly after the second shot.

FIG. 11B illustrates movement of the reticle stage 2 and wafer stage 5 for each of the shots after the first shot. In this FIG., 1 (small letter of L), designates the idealistic displacement of the wafer stage 5 for each shot; each of L(l), L(l−Δl$_1$), L(l+Δl$_2$), . . . designates the actual displacement of the wafer stage 5; and each of Δl$_1$, Δl$_2$, Δl$_3$ . . . designates the amount of positional deviation.

According to the present embodiment, the reticle stage 2 is returned to the reference position P$_0$ for each stepwise movement of the wafer stage 5. Therefore, as will been seen from FIG. 11B, even if the actual displacement of the wafer stage 5 fluctuates with respect to the reference position P$_0$, only the movement of the reticle stage 2 for correcting the error Δl$_1$, Δl$_2$, Δl$_3$ . . . or Δl$_n$ is required. It is no more necessary to move the reticle stage 2 through a distance corresponding to the error Δl$_1$+Δl$_2$. The movement of the reticle stage 2 back to the reference position P$_0$ is effected simultaneously with the stepwise movement of the wafer stage 5. Thus, it does not adversely affect the time required for the alignment operation.

The error caused by the stepwise movement of the wafer stage 5 may be measured by a laser interferometer, magnetic scale in which information on the length is recorded on a magnetic tape, or an optical scale in which interference fringes formed by a slit is read out. As a further alternative, the positional deviation may be measured by using the alignment marks on the reticle 2 and wafer 4. In the last-mentioned case, a TTL alignment system are preferable.

In the foregoing embodiments, the term "reticle" comprehensively means a reticle or a mask. Further, the present invention is also applicable to an exposure apparatus of one-to-one magnification projection.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for printing an image of a pattern of a first object onto each of a plurality of different portions of a second object, said apparatus comprising:
   projection means for projecting the image of the pattern of the first object onto the second object in a reduced scale;
   means providing an exposure beam for irradiating the first object to transfer the image of the pattern of the first object by way of said projection means onto the second object;
   driving means for moving stepwise the second object to sequentially position each of the plurality of different portions of the second object with respect to the first object for transfer of the image of the pattern of the first object onto each of the plurality of different portions of the second object by said irradiating means;
   means for detecting positional deviation of one of the plurality of different portions of the second object with respect to the first object, said one of said portions being that just positioned by the stepwise movement to be exposed to the image of the pattern of the first object;
   means for discriminating whether or not the positional deviation detected by said detecting means is greater than a predetermined amount; and
   means responsive to said discriminating means, for correcting the positional deviation of said one portion of the second object with respect to the first object;
   said deviation-correcting means operating to move at least the second object when the positional deviation detected by said detecting means is greater than the predetermined amount and operating to move only the first object where the positional deviation detected by said detecting means is not greater than the predetermined amount, whereby said one portion of the second object is aligned with respect to the first object; and said deviation-correcting means operating to correct the positional deviation of said one portion of the second object prior the initiation of the stepwise movement of the second object for exposure of the subsequent one of the plurality of different portions of second object.

2. An apparatus according to claim 1, wherein said detecting means detects the positional deviation of said one portion of the second object with respect to the first object, by way of said projection means.

3. An apparatus according to claim 1, further comprising means for producing a scanning beam and wherein said detecting means operates to detect the positional deviation using the scanning beam passing through said projection means.

4. An apparatus according to claim 1, wherein said detecting means is operated each time the second object is moved stepwise thereby to detect the positional deviation with respect to the first object of each of the plurality of different portions of the second object as sequentially positioned by stepwise movement by said driving means.

5. An apparatus for printing an image of a pattern of a first object onto each of a plurality of different portions of a second object, said apparatus comprising:
   projection means for projecting the image of the pattern of the first object onto the second object;
   means providing an exposure beam for irradiating the first object to transfer the image of the pattern of the first object by way of said projection means onto the second object;
   driving means for moving stepwise the second object to sequentially position each of the plurality of different portions of the second object with respect to the first object for transfer of the image of the pattern of the first object onto each of the plurality of different portions of the second object by said irradiating means;
   means for detecting positional deviation of one of the plurality different portions of the second object with respect to the first object, said one of the portions being that just positioned by the stepwise movement to be exposed to the image of the pattern of the first object;
   first adjusting means responsive to the detection by said detecting means to move at least one of the first and second objects to align the said one of the plurality of portions of the second object with respect to the first object; and
   second adjusting means responsive to the detection by said detecting means and controlling said driving means to change the amount of stepwise movement of the second object to be subsequently made by said driving means by an amount corresponding to said positional deviation detected by said detecting means.

6. An apparatus according to claim 5, wherein said projection means projects the image of the pattern of the first object onto the second object in a reduced scale.

7. An apparatus according to claim 5, wherein said detecting means detects the positional deviation of said one of the plurality of portions of the second object with respect to the first object, by way of said projection means.

8. An apparatus according to claim 5, wherein detection by said detecting means and adjustment by said first adjusting means are repeated in an alternating order until the positional deviation detected by said detecting means reaches a value not greater than a predetermined value.

9. An apparatus according to claim 8, wherein said second adjusting means operates to change the amount of stepwise movement of the second object to be made by said driving means in accordance with the positional deviation which is first detected by said detecting means with respect to said one of the plurality of portions of the second object.

10. An apparatus for printing an image of a pattern of a first object onto each of a plurality of different portions of a second object, said apparatus comprising:

projection means for projecting the image of the pattern of the first object onto the second object;

means providing an exposure beam for irradiating the first object to transfer the image of the pattern of the first object by way of said projection means onto the second object;

driving means for moving stepwise the second object to sequentially position each of the plurality of different portions of the second object with respect to the first object for transfer of the image of the pattern of the first object onto each of the plurality of different portions of the second object;

means for detecting positional deviation of one of the plurality of different portions of the second object with respect to the first object, said one of portions being that just positioned by the stepwise movement to be exposed to the image of the pattern of the first object;

first adjusting means responsive to the detection by said detecting means to move at least one of the first and second objects to align said one of the plurality of portions of the second object with respect to the first object; and second adjusting means responsive to the detection by said detecting means and controlling said driving means to change the amount of stepwise movement of the second object to be subsequently made by said driving means by an amount corresponding to said positional deviation detected by said detecting means;

said first adjusting means moving the first object from its initial position when said first adjusting means moves the first object to align said one of the plurality of portions of the second object with respect to the first object; and said first adjusting means moving the first object back to said initial position during the stepwise movement of the second object to be subsequently made by said driving means for the exposure of the subsequent one of the plurality of portions of the second object.

* * * * *

UNITED STATES PATENT AND TRADEMARK OFFICE
CERTIFICATE OF CORRECTION

PATENT NO. : 4,669,867
DATED : June 2, 1987
INVENTOR(S) : KOJI UDA, ET AL.

It is certified that error appears in the above-identified patent and that said Letters Patent is hereby corrected as shown below:

COLUMN 1

Line 13, "large scaled" should read --large-scale--
    Line 14, "large scaled" should read --large-scale--

COLUMN 3

Line 15, "EMBODIMENT" should read --EMBODIMENTS--.

COLUMN 5

Line 24, "f-8" should read --$f\text{-}\theta$--.
    Line 52, "spot like" should read --spot-like--.
    Line 68, "sytem" should read --system--.

COLUMN 6

Line 3, "position," should read --positions,--.

COLUMN 7

Line 7, "of FIG.3" should read --of the FIG.3--.
    Line 42, "hot" should read --not--.

COLUMN 9

Line 12, "aligment" should read --alignment--.

COLUMN 10

Line 35, "mahner," should read --manner,--.

UNITED STATES PATENT AND TRADEMARK OFFICE
CERTIFICATE OF CORRECTION

PATENT NO. : 4,669,867  
DATED : June 2, 1987  
INVENTOR(S) : KOJI UDA, ET AL.

Page 2 of 2

It is certified that error appears in the above-identified patent and that said Letters Patent is hereby corrected as shown below:

COLUMN 11

Line 33, "aligment" should read --alignment--.

COLUMN 13

Line 26, "is" should read --are--.  
    Line 31, "are" should read --is--.

COLUMN 16

Line 9, "of portions" should read --of said portions--.

Signed and Sealed this

Thirteenth Day of October, 1987

Attest:

DONALD J. QUIGG

*Attesting Officer*       *Commissioner of Patents and Trademarks*